United States Patent
Ryoo et al.

(10) Patent No.: US 10,062,440 B1
(45) Date of Patent: Aug. 28, 2018

(54) NON-VOLATILE SEMICONDUCTOR MEMORY DEVICE AND READING METHOD THEREOF

(71) Applicant: Winbond Electronics Corp., Taichung (TW)

(72) Inventors: Pil-Sang Ryoo, Taichung (TW); Wen-Chiao Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/627,460

(22) Filed: Jun. 20, 2017

(51) Int. Cl.
G11C 11/34 (2006.01)
G11C 16/26 (2006.01)
G11C 16/34 (2006.01)
G11C 16/14 (2006.01)
G11C 16/30 (2006.01)
G11C 16/08 (2006.01)

(52) U.S. Cl.
CPC ............ G11C 16/26 (2013.01); G11C 16/08 (2013.01); G11C 16/14 (2013.01); G11C 16/30 (2013.01); G11C 16/3427 (2013.01)

(58) Field of Classification Search
CPC ..... G11C 16/26; G11C 16/3427; G11C 16/14; G11C 16/30; G11C 16/08
USPC ........................................ 365/185.02, 185.29
See application file for complete search history.

(56) References Cited

U.S. PATENT DOCUMENTS

| 5,065,364 | A | * | 11/1991 | Atwood | G11C 16/12 365/185.02 |
| 5,245,570 | A | * | 9/1993 | Fazio | G11C 8/12 365/185.02 |
| 5,267,196 | A | * | 11/1993 | Talreja | G11C 5/025 365/185.02 |
| 5,280,447 | A | * | 1/1994 | Hazen | G11C 5/025 365/185.02 |
| 5,329,488 | A | * | 7/1994 | Hashimoto | G11C 29/808 365/185.09 |
| 5,544,117 | A | * | 8/1996 | Nakayama | G11C 16/16 365/185.11 |
| 5,546,339 | A | * | 8/1996 | Oyama | G11C 16/10 365/185.02 |
| 5,615,153 | A | * | 3/1997 | Yiu | G11C 16/10 365/185.02 |
| 5,671,177 | A | * | 9/1997 | Ueki | G11C 16/0416 257/E27.103 |
| 5,673,224 | A | * | 9/1997 | Chevallier | G11C 16/10 257/E27.103 |

(Continued)

Primary Examiner — Viet Q Nguyen
(74) Attorney, Agent, or Firm — JCIPRNET

(57) ABSTRACT

A non-volatile semiconductor memory device capable of eliminating influence of bit line (BL) leakage on reading and a reading method thereof. The non-volatile semiconductor memory device includes a memory array, a semiconductor well having a plurality of erase units, and a source switch array having a plurality of source switches. Each of the source switches is coupled to a common source line of one erase unit of the semiconductor well. Only one source switch among the source switches coupled to a selected erase unit among the erase units of the semiconductor well for reading is enabled during a reading operation. Thus, the BL leakage is prevented from affecting the reading operation on memory cells of the memory array, thereby improving the reliability of the non-volatile semiconductor memory device.

13 Claims, 4 Drawing Sheets

(56) References Cited

U.S. PATENT DOCUMENTS

| | | | | |
|---|---|---|---|---|
| 5,677,874 A * | 10/1997 | Yamano | ............ | G11C 16/30 |
| | | | | 365/185.18 |
| 5,761,127 A * | 6/1998 | Akaogi | ............ | G11C 16/08 |
| | | | | 257/E21.688 |
| 5,875,130 A * | 2/1999 | Haddad | ............ | G11C 16/10 |
| | | | | 365/185.33 |
| 5,936,886 A * | 8/1999 | Fujio | ............ | G11C 16/30 |
| | | | | 365/185.11 |
| 5,946,232 A * | 8/1999 | Yoon | ............ | G11C 16/08 |
| | | | | 365/185.11 |
| 5,959,884 A * | 9/1999 | Chevallier | ............ | G11C 16/10 |
| | | | | 257/E27.103 |
| 5,974,499 A * | 10/1999 | Norman | ............ | G11C 16/10 |
| | | | | 711/103 |
| 6,026,021 A * | 2/2000 | Hoang | ............ | G11C 8/12 |
| | | | | 365/185.11 |
| 6,097,636 A * | 8/2000 | Nojima | ............ | G11C 16/08 |
| | | | | 365/185.05 |
| 6,229,734 B1 * | 5/2001 | Watanabe | ............ | G11C 16/3404 |
| | | | | 365/185.18 |
| 7,339,824 B2 * | 3/2008 | Lee | ............ | G11C 16/0408 |
| | | | | 365/185.11 |
| 7,480,180 B2 * | 1/2009 | Umezawa | ............ | G11C 16/0416 |
| | | | | 257/E27.103 |
| 7,636,252 B2 * | 12/2009 | Lee | ............ | H01L 27/11524 |
| | | | | 365/185.05 |
| 7,760,580 B2 * | 7/2010 | Wang | ............ | G11C 16/12 |
| | | | | 365/230.01 |
| 9,355,717 B1 | 5/2016 | Nazarian et al. | | |
| 9,417,818 B2 | 8/2016 | Takeuchi | | |
| 2014/0089570 A1 | 3/2014 | Takeuchi | | |

* cited by examiner

NON-VOLATILE SEMICONDUCTOR MEMORY DEVICE AND READING METHOD THEREOF

BACKGROUND OF THE INVENTION

1. Field of the Invention

The disclosure relates to a non-volatile semiconductor memory device, especially relates to a memory device having plurality of source switches capable of eliminating an influence of bit line (BL) on reading memory cells, and a reading method thereof.

2. Description of Related Art

Flash memory is applied to a wide variety of electronic equipment, such as digital camera, smartphone, etc. In the market, the flash memory is required to be small in volume and large in capacity, and is further required to have high speed, low power consumption and high reliability in storing information.

In order to achieve small die size, multiple erase units are located in a single semiconductor well and these erase units are erased individually by different high voltage decoding for each erase unit. Those multiple erase units share a bit line as well as the semiconductor well. However, when BL leakage occurs on at least one memory cell of a specific erase unit, the BL leakage may corrupt a read operation on memory cells of all the erase units that share the BL with the specific erase unit. Over erasure is one of the reasons that cause BL leakage. More specifically, a usual erase operation includes a post program step to verify and recover over erased bits. However, if there is a sudden power off or a suspend command entering during an erase operation, the post program step is not performed leaving behind over erased cells that cause BL leakage. As a result, the reading operation on memory cells of the erase units that share the bit line may fail, and reliability of the flash memory is reduced.

Failure in reading a memory cell may happen in non-over erase situation such as Ioff (channel leakage current when Vg=0V). For example, since the channel leakage current Ioff increased specially in high temperature, read operations on memory cells may fail when Ioff is too high.

Along with the popularity of flash storage devices, it is desirable for having non-volatile semiconductor memory devices (e.g., flash memory devices) that are smaller die size and are more reliable in storing information.

SUMMARY OF THE INVENTION

A non-volatile semiconductor memory device and a reading method thereof capable of eliminating the influence of BL leaking on reading memory cells are introduced in this disclosure. The non-volatile semiconductor memory device includes a memory array having a plurality of memory cells, a semiconductor well having a plurality of erase units, and a source switch array having a plurality of source switches. Each erase unit of the semiconductor well includes a plurality of memory cells which share a common source line, and each of the source switches is electrically coupled to the common source line of one of the erase units. During a read operation, only one source switch among the source switches coupled to a selected erase unit among the erase units of the semiconductor well is enabled, where the selected erase unit has at least one memory cell which is selected for reading.

The source switches are disposed outside the memory array, the non-volatile semiconductor memory device is a flash memory device, and the semiconductor well is a p-well.

In an embodiment of the disclosure, each of the source switches has a control terminal, and the control terminals of the source switches are electronically isolated from word lines of the memory cells of memory array.

The non-volatile semiconductor memory device may further include a source switch decoder having a first input terminal receiving a global-enable signal, a plurality of second input terminals receiving a plurality of erase-unit-enable signals, and a plurality of output terminals coupled to the source switches to output source-switch-enable signals the source switches.

A reading method of the disclosure includes steps of selecting an erase unit among the erasing units of the semiconductor well, enabling the source switch which is electrically coupled to the selected erase unit and disabling the source switches which are electrically coupled to non-selected erase units.

In embodiments of the disclosure, only the source switch which is coupled to the selected erase unit is enabled and the other source switches which are coupled to the non-selected erase units are disabled. As such, the BL leakage (e.g., caused by over erased cells) are prevented from interrupting the read operations on memory cells of the erase units that share the bit lines. Accordingly, the non-volatile semiconductor memory device in the disclosure archives small die size and high reliability.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

It is to be understood that other embodiment may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
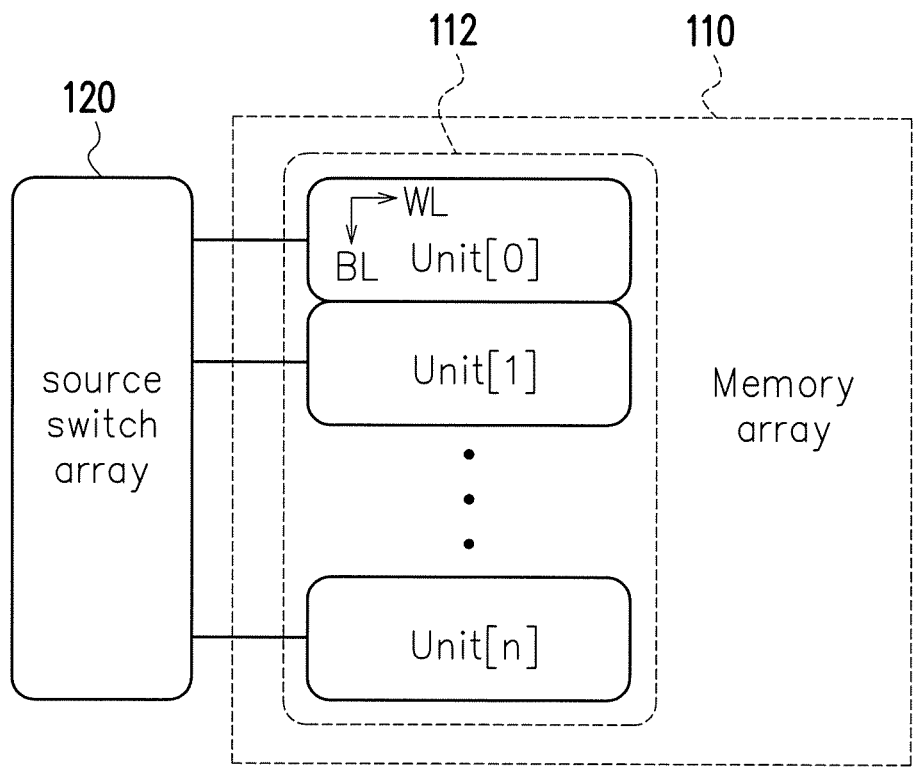
FIG. 1 is a diagram illustrating a schematic structure of a non-volatile memory device according to an embodiment of the disclosure.

Referring to FIG. 1, a flash memory 100 includes a memory array 110 which has a plurality of memory cells and a source switch array 120 which is coupled to the memory array and has a plurality of source switches. The memory cells of the memory array 110 are arranged in erase units (blocks/sectors), where an erase operation is carried out in an erase unit. Each of the erase units has at least one memory cell, and a quantity of memory cells in one erase unit may be the same as or different from a quality of memory cells in another erase unit.

The memory array 110 includes at least one of semiconductor well 112 which contains a plurality of erase units Unit[0], Unit[1] to Unit[n] arranged in a bit line direction BL and share common bit lines. In other words, the erase units Unit[0], Unit[1] to Unit[n] of the semiconductor well 112 share the common bit lines and the semiconductor well 112. It should be noted that the semiconductor well 112 may be a p-type semiconductor well (p-well) or a n-type semiconductor well (n-type). In addition, the bit line direction BL may be orthogonal with a word line direction WL of the memory cells, but the disclosure is not limited thereto.

The source switch array 120 is coupled to the each of the erase units Unit[0], Unit[1] to Unit[n] of the semiconductor well 112 and is configured to enable or disable electrical connections between the source switch array 120 and the erase units Unit[0], Unit[1] to Unit[n] of the semiconductor well 112.

Figure 2:
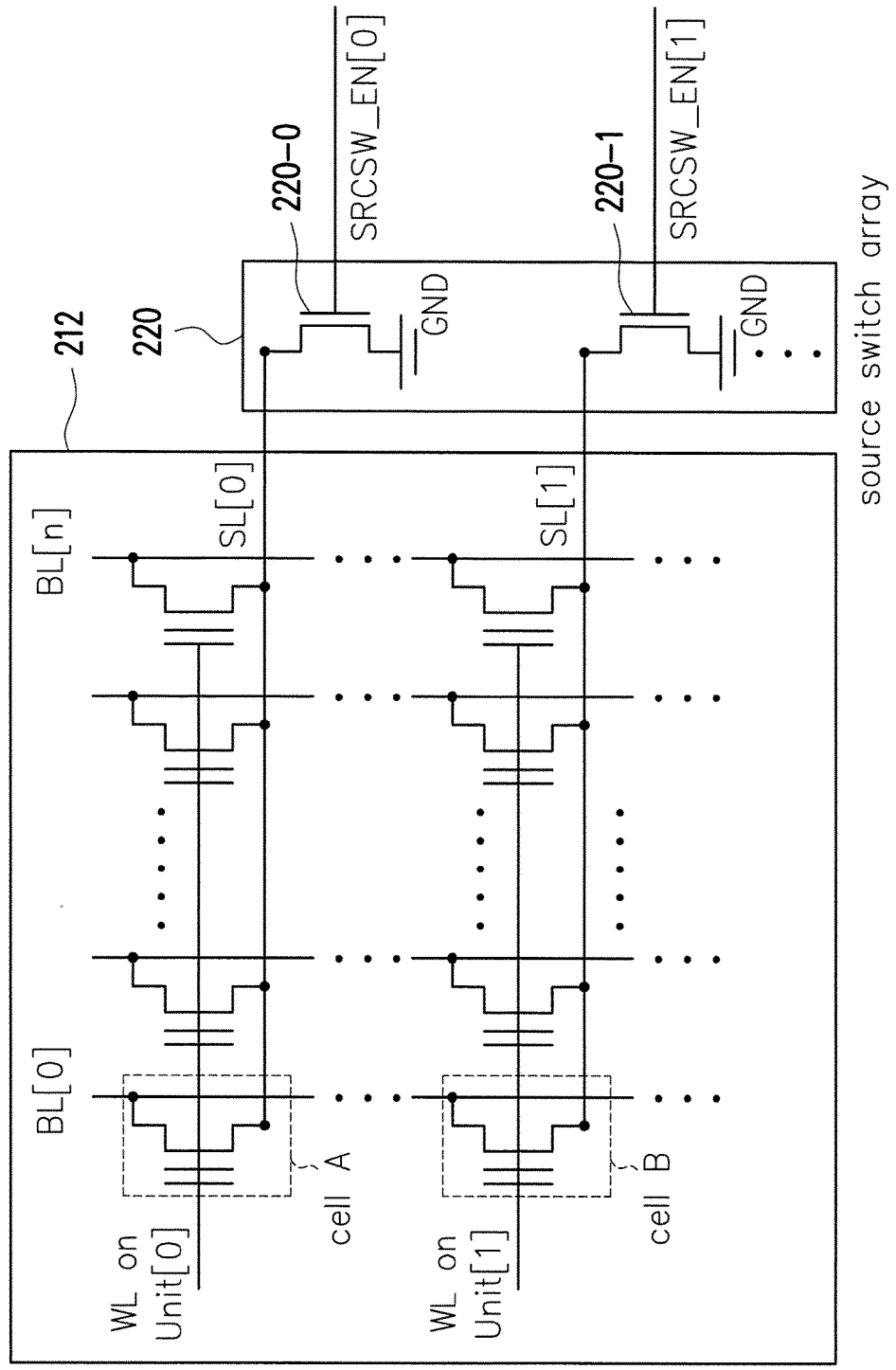
FIG. 2 is a diagram illustrating a detailed structure of a semiconductor well and a source switch array of a non-volatile memory device according to an embodiment of the disclosure.

Referring to FIG. 2, a memory cells shown in FIG. 2 are NOR flash memory cells, but the disclosure should not be limited to any specific type of memory cells. Referring to FIG. 2, the non-volatile semiconductor memory device 200 includes a semiconductor well 212 and a source switch array 220. The semiconductor well 212 includes a plurality of erase units, in which each erase unit of the semiconductor well 212 has a plurality of memory cells which share a common source line. The memory cells of the first erase unit Unit[0] share the first common source line SL[0], the memory cells of the second erase unit Unit[1] share the second common source line SL[1], and the configuration of other erase units of the semiconductor well 212 may be deduced by analogy.

The memory array of the non-volatile memory device 200 includes a plurality of memory cells which are arranged at positions that word lines of the memory cells intersect bit lines of the memory cells. The direction of the word lines may be the same as a direction of the common source lines, and the direction of the word lines may be orthogonal to the direction of the bit lines. Each erase unit of the semiconductor well 212 includes at least one word line. In an embodiment of the disclosure, a quantity of the word lines in each erase unit of the semiconductor well 212 is fixed at a predetermined number (e.g., 16 word lines), but the disclosure is not limited thereto.

The source switch array 220 includes a plurality of source switches, in which each source switch of the source switch array 220 is electrically coupled to the common source line of one erase unit of the semiconductor well 212. As shown in FIG. 2, the first source switch 220-0 is electrically coupled to the first common source line SL[0] of the first erase unit Unit[0] and the second source switch 220-1 is electrically coupled to the second source line SL[1] of the second erase unit Unit[1]. Similarly, the other source switches of the source switch array are coupled to the corresponding common source lines of the corresponding erase units.

Each of the source switches of the source switch array 220 has a first coupled to one of the common source line, a second terminal coupled to a power source (e.g., ground) and a control terminal received a source-switch-enable signal. The power source can be a ground which can be a digital ground or an analog ground, but the disclosure is not limited thereto. For example, the first source switch 220-0 has the first terminal coupled to the first common source line SL[0], the second terminal coupled to the ground GND, and the control terminal received the first source-switch-enable signal SRCSW_EN[0]. The second source switch 220-1 has the first terminal coupled to the second common source line SL[1], the second terminal coupled to the ground GND, and the control terminal received the second source-switch-enable signal SRCSW_EN[1].

The first source switch 220-0 and the second source switch 220-1 are configured to enable or disable an electrical connections between the corresponding erases units Unit[0] and Unit[1] and the power source. The first and second source switches 220-0 and 220-1 receive dedicated source-switch-enable signals SRCSW_EN[0] and SRCSW_EN[1] respectively, so as to enable or disable the electrical connections between the erases units Unit[0] and Unit[1] and the power source according to the source-switch-enable signals SRCSW_EN[0] and SRCSW_EN[1].

In an embodiment of the disclosure, the source switch array 220 is disposed outside the memory array of the non-volatile semiconductor memory device 200, thereby improving the mobility and expanding the application of the source switch array 220. However, the disclosure is not limited thereto, the source switch array 220 may be embedded inside the memory array of the non-volatile semiconductor memory device 200 for purpose of minimizing the die size and saving power consumption.

When the source switch array 220 is disposed outside the memory array, the source switches of the source switch array 220 are disposed on the extending direction of the word lines of the memory cells. Each of the erase units of the semiconductor well 212 include a predetermined number of word lines (e.g., 16), and each source switch is configured for said predetermined number of word lines.

In operation, the first source switch 220-0 is configured to enable the electrical connection between the first common source line SL[0] and the ground GND when there is at least one memory cell within the first erase unit Unit[0] is selected for reading. Similarly, the second source switch 220-1 is configured to enable the electrically connection between the second common source line SL[1] and the ground GND when there is at least one memory cell within the second erase unit Unit[1] is selected for reading. In other words, a certain source switch is only enabled when the erase unit coupled to the certain source has at least one selected memory cells for reading. Meanwhile, the source switches coupled to non-selected erase units (e.g., the erase units that does not include any memory cells selected for reading) are disabled to electrically isolate these non-selected erase units from the ground GND.

It is supposed that the first erase unit Unit[0] has a memory cell A which is suffered from BL leakage (current on the first common source line SL[0] may be leaked to the bit line BL[0] via the memory cell A). There are a number of different reasons that cause the BL leakage on the memory cell A. For example, if there is a sudden power off or a suspend command entering during erasing operation on the first erase unit Unit[0], the post program step for recovering the over erased bits has not performed, thus leaving the over erased cells within the erase unit Unit[0]. If the memory cell A is one of the over erased memory cells, it is likely to have BL leakage on bit line BL[0] through the cell A. When there is BL leakage on bit line BL[0], a reading operation on the memory cells (e.g., cell B in the second erase unit Unit[1]) that share the bit line BL[0] could fail because of the BL leakage.

The disclosure provides a dedicated source switch for each of the erase unit of the semiconductor well 212, where the dedicated source switch is only enabled when the corresponding erase unit coupled to the dedicated source switch has at least one selected memory for reading. For example, when the memory cell B in the second erase unit Unit[1] of the semiconductor well 212 is selected for reading, the erase unit Unit[1] is considered as a selected erase unit for reading. The second source switch 220-1 which is coupled to the second common source line SL[1] of the second erase unit Unit[1] is enabled by the source-switch-enable signal SRCSW_EN[1] to electrically connect the second common source line SL[1] with the ground GND during the reading operation on the memory cell B. Meanwhile, the other source switches of the source switch array 220 are disabled by the corresponding source-switch-enable signals so as to electrically isolate the corresponding common source lines from the ground GND. In other words, only the source switch 220-1 is enabled during the read operation of the memory cell B, and all the other source switches of the source switch array 220 is disabled. In this way, even if there is leakage on the BL[0] caused by the over erased memory cell A, the influence of the BL leakage on the reading of the memory cell B is eliminated because the first common source line SL[0] is electrically isolated from the ground GND. As a result, the reading operation on the memory cell B of the erase unit Unit[1] is not influenced by the BL leakage occurred on the Unit[0], and the memory cell B is correctly read even if the memory cell A which shares the same bit line BL[0] with the memory cell B is over erased.

Figure 3:
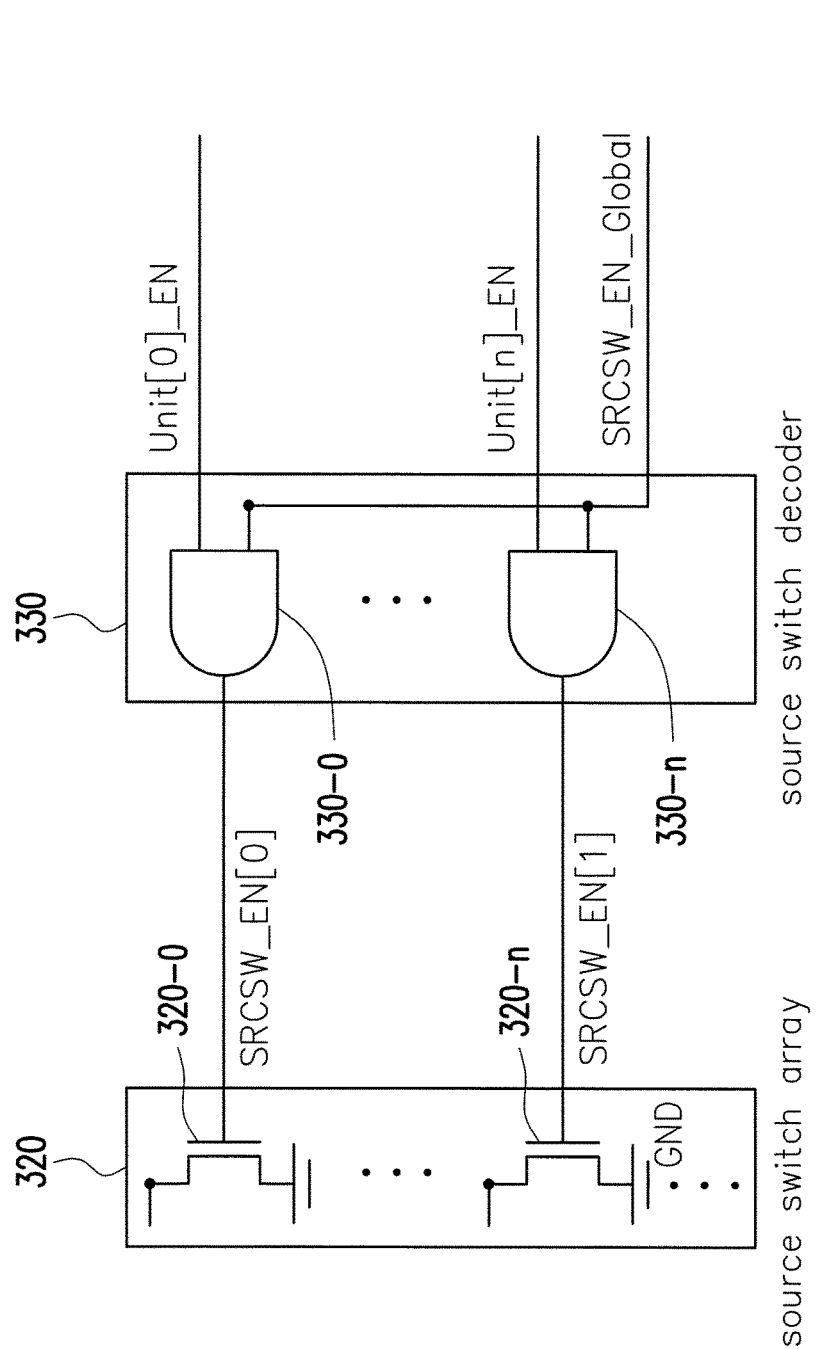
FIG. 3 is a diagram illustrating a schematic structure of a source switch array and a source switch decoder of a non-volatile memory device according to an embodiment of the disclosure.

FIG. 3 illustrates a schematic structure of a source switch array 320 and a source switch decoder 330 of a non-volatile memory device 300 according to an embodiment of the disclosure. The source switch array 320 is coupled to the source switch decoder 330 to receive the plurality of source-switch-enable signals outputted from the source switch decoder 330. The source switch array 320 includes a plurality of source switches 320-0 to 320-n which have control terminals receiving the source-switch-enable signals SRCSWEN[0] to SRCSW_EN[n] respectively.

The source switch decoder 330 has a first input terminal receiving a global-enable signal SRCSW_EN_Global, a plurality of second input terminals receiving erase-unit-enable signals Unit[0]_EN to Unit[b]_EN, and a plurality of output terminals outputting source-switch-enable signals SRCSW_EN[0] to SRCSW_EN[n] to the source switches 320-0 to 320-n respectively.

The source switch decoder 330 may include a plurality of logic gates 330-0 ... 330-n, where each of the logic gate has a first input terminal receiving one of the erase-unit-enable signals Unit[0]_EN to Unit[n]_EN, a second input terminal receiving a global-enable signal SRCSW_EN_Global, and an output terminal outputting one of the source-switch-enable signals SRCSW_EN[0] to SRCSW_EN[n]. In FIG. 3, the logic gates 330-0 to 330-n are the AND gates, but the disclosure is not limited thereto. The logic gates 330-0 to 330-n can be OR gates, NOR gates, NAND gates or any combination thereof. It would be appreciated that the circuit configuration of the source switch decoder 330 may be changed in accordance with the type of used logic gates.

In an embodiment of the disclosure, the global-enable signal SRCSW_EN_Global can be an always-on signal or always-enable signal, and a certain erase-unit-enable signal among the erase-unit-enable signals Unit[0]_EN to Unit[n]_EN is enabled when the erase unit corresponding to the certain erase-unit-enable signal is selected for reading. For example, when the memory cell B in the second erase unit Unit[1] shown in FIG. 2 is selected for reading, the erase-unit-enable signal Unit[1]_EN corresponding to the second erase unit Unit[1] is enabled, and the source-switch-enable signal SRCSW_EN[1] are outputted to the source switch array 320.

Figure 4:
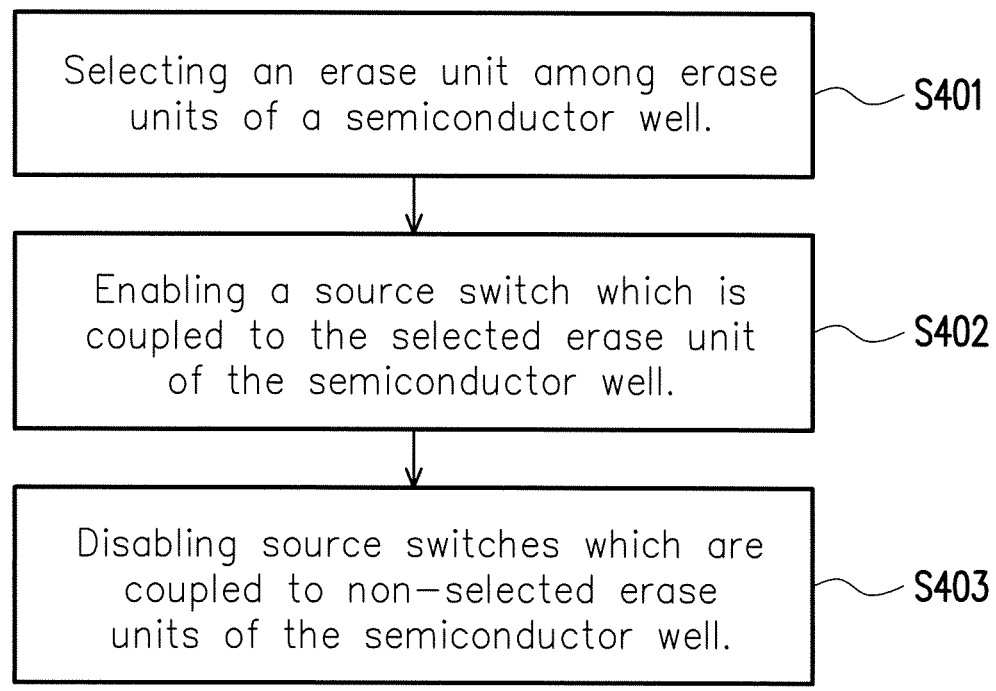
FIG. 4 is a flowchart illustrating steps of a reading method according to an embodiment of the disclosure.

FIG. 4 illustrates steps of a reading method according to an embodiment of the disclosure. In step S401, an erase unit among the erase units of a semiconductor well is selected. The selected erase unit includes at least one memory cell which is selected for reading. Please note that all the memory cells within one erase unit of the semiconductor well share a common source line which is coupled to one of the source switches of the source switch array.

In step S402, the source switch which is coupled to the common source line of the selected erase unit is enabled so as to electrically connect the common source line of the selected erase unit with the power source (e.g., ground GND shown in FIG. 2).

In step S403, the other source switches which are coupled to non-selected erase units are disabled so as to electrically isolate the non-selected erase units from the power source (e.g., ground GND shown in FIG. 2).

It should be noted that each of the source switches of the source switch array has a control terminal for receiving a dedicated erase-unit-enable signal which is different from the word lines of the memory cells.

In summary, the embodiments of the disclosure introduce a non-volatile memory device and a reading method thereof capable of eliminating the influence of BL leakage on reading memory cells. A dedicated source switch is coupled to each erase unit of a semiconductor well, and the dedicated source switch is only enabled when the erase unit corresponding to the dedicated source switch is selected for reading. The other source switches which are coupled to non-selected erase units for reading are disabled. In this way, the disclosure may eliminate the influence of the BL leakage to reading operation on the erase units that share the leaked BL, thereby improving the reliability of the flash memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile semiconductor memory device, comprising:
   a memory array, comprising a plurality of memory cells;
   a semiconductor well, comprising a plurality of erase units, wherein each erase unit of the semiconductor well comprises a plurality of memory cells which share a common source line; and
   a source switch array, comprising a plurality of source switches, coupled to the erase units of the semiconductor well, wherein each of the source switches is coupled to the common source line of one erase unit of the semiconductor well,
   wherein only one source switch among the source switches coupled to a selected erase unit among the erase units of the semiconductor well for reading is enabled to supply a predetermined voltage the selected erase unit during a reading operation, and the other source switches are disabled to float the common source lines of non-selected erase units during a reading operation.

2. The non-volatile semiconductor memory device of claim 1, wherein the selected erase unit has at least one memory cell which is selected for reading.

3. The non-volatile semiconductor memory device of claim 1, wherein each of the erase units of the semiconductor well comprises a predetermined number of word lines, and each of the source switches is configured for said predetermined number of word lines.

4. The non-volatile semiconductor memory device of claim 1, wherein the source switches of the source switch array are disposed outside the memory array.

5. The non-volatile semiconductor memory device of claim 1, wherein each of the source switches has a first terminal coupled to the common source line of one of the erase units, a second terminal coupled to a power source, and a control terminal received a source-switch-enable signal to enable or disable the source switch according to the source-switch-enable signal,
   wherein the control terminals of the source switches are electrically isolated from word lines of the memory cells.

6. The non-volatile semiconductor memory device of claim 1, wherein the memory cells of the memory array are arranged at positions that word lines of the memory cells intersect bit lines of the memory cells, and the source switches are disposed on an extended direction of the word lines.

7. The non-volatile semiconductor memory device of claim 6, wherein a direction of the word lines is same as a direction of the common source line, the direction of the word lines is orthogonal to a direction of the bit lines, and the source switches are coupled to ends of the common source lines of the erase units.

8. The non-volatile semiconductor memory device of claim 1, further comprising:

a source switch decoder, comprising a first input terminal receiving a global-enable signal, a plurality of second input terminals receiving a plurality of erase-unit-enable signals, and a plurality of output terminals coupled to control gates of the source switches to output the source-switch-enable signals to the control gates of the source switches.

9. The non-volatile semiconductor memory device of claim 8, wherein the source switch decoder comprises a plurality of logical gates, each of the logical gates receives the global-enable signal and one of the erase-unit-enable signals and outputs one of the source-switch-enable signals to the control gate of the corresponding source switch.

10. The non-volatile semiconductor memory device of claim 8, wherein the logical gates comprise at least one AND gate.

11. The non-volatile semiconductor memory device of claim 1, wherein the non-volatile semiconductor memory device is a flash memory device, and the semiconductor well is a p-well.

12. A reading method of a non-volatile semiconductor memory device, wherein the non-volatile semiconductor memory device comprising a memory array, a semiconductor well having a plurality of erase units and a source switch array having a plurality of source switches coupled to erase units, the reading method comprising:
   selecting an erase unit among the erasing units of the semiconductor well, wherein the selected erase unit comprises at least one memory cell which is selected for reading;
   enabling the source switch which is electrically coupled to the selected erase unit to supply a predetermined voltage the selected erase unit; and
   disabling the source switches which are electrically coupled to non-selected erase units to float the common source lines of non-selected erase units.

13. The reading method of the non-volatile semiconductor memory device of claim 12, wherein the source switches are controlled by source-switch-enable signals which are different from signals on word lines of the memory cells.

* * * * *